(12) United States Patent
Lu et al.

(10) Patent No.: US 12,336,417 B2
(45) Date of Patent: Jun. 17, 2025

(54) DISPLAY PANELS, AND PREPARATION METHODS THEREOF AND DISPLAY APPARATUSES

(71) Applicants: Chongqing BOE Display Technology Co., Ltd., Chongqing (CN); BOE Technology Group Co., Ltd., Beijing (CN)

(72) Inventors: Yuqun Lu, Beijing (CN); Jie Li, Beijing (CN); Yang Yu, Beijing (CN); Chuntong Jiang, Beijing (CN); Teng Chen, Beijing (CN); Lingling Wang, Beijing (CN); Wenqiang Wang, Beijing (CN)

(73) Assignees: Chongqing BOE Display Technology Co., Ltd., Chongqing (CN); BOE Technology Group Co., Ltd., Beijing (CN)

(*) Notice: Subject to any disclaimer, the term of this patent is extended or adjusted under 35 U.S.C. 154(b) by 309 days.

(21) Appl. No.: 17/359,452

(22) Filed: Jun. 25, 2021

(65) Prior Publication Data
US 2022/0149122 A1    May 12, 2022

(30) Foreign Application Priority Data
Nov. 9, 2020    (CN) .......................... 202011240168.1

(51) Int. Cl.
*H10K 50/84*    (2023.01)
*H10D 86/00*    (2025.01)
*H10K 59/122*   (2023.01)
*H10K 59/65*    (2023.01)
*H10K 71/00*    (2023.01)
*H10K 59/80*    (2023.01)

(52) U.S. Cl.
CPC ............. *H10K 59/65* (2023.02); *H10K 50/84* (2023.02); *H10K 59/122* (2023.02); *H10K 71/00* (2023.02); *H10K 59/8731* (2023.02)

(58) Field of Classification Search
CPC ..................................................... H10K 59/65
See application file for complete search history.

(56) References Cited

U.S. PATENT DOCUMENTS

2017/0373128 A1\* 12/2017 Lee ...................... H10K 59/131
2021/0083019 A1\*  3/2021 Jang ..................... H10K 50/84
(Continued)

*Primary Examiner* — Chad M Dicke
*Assistant Examiner* — Valerie N Newton
(74) *Attorney, Agent, or Firm* — IPro, PLLC

(57) ABSTRACT

The present disclosure provides a display panel and preparing method thereof, and a display apparatus. In one or more embodiments, the display panel includes a substrate that includes an off-screen camera region including a plurality of opening regions, a flexible layer located at a side of the substrate, a backplate layer located at a side of the flexible layer away from the substrate and including a plurality of light-transmitting film layers, and a light-emitting device layer located at a side of the backplate layer away from the substrate and including a plurality of cathodes. An orthographic projection of the flexibly layer on the substrate is not overlapped with the opening regions. An orthographic project of at least one light-transmitting film layer on the substrate covers the opening regions. Orthographic projections of the cathodes on the substrate are not overlapped with the opening regions.

15 Claims, 7 Drawing Sheets

(56) References Cited

U.S. PATENT DOCUMENTS

| | | | | |
|---|---|---|---|---|
| 2021/0175303 A1* | 6/2021 | Bang | .................... | H10K 59/122 |
| 2021/0234122 A1* | 7/2021 | Choi | .................... | H02M 7/483 |
| 2021/0249635 A1* | 8/2021 | Cho | .................... | H10K 59/121 |
| 2021/0359262 A1* | 11/2021 | Sun | ........................ | H10K 59/65 |
| 2021/0408444 A1* | 12/2021 | Ouyang | ............... | H10K 50/865 |

* cited by examiner

DISPLAY PANELS, AND PREPARATION METHODS THEREOF AND DISPLAY APPARATUSES

CROSS REFERENCE TO RELATED APPLICATIONS

This application claims priority to Chinese Patent Application No. 2020112401681 entitled "DISPLAY PANEL AND PREPARATION METHOD THEREOF AND DISPLAY APPARATUS" filed on Nov. 9, 2020, the entire content of which is incorporated herein by reference.

TECHNICAL FIELD

The present disclosure relates to the field of display technologies, and in particular to a display panel, and a preparation method thereof and display apparatus.

BACKGROUND

Along with continuous progress of scientific technologies, people have increasing requirements and demands for smart terminals (for example, mobile phones), and the off-screen camera technology becomes more and more popular among users.

SUMMARY

A first aspect of the present disclosure provides a display panel, including:
  a substrate, where the substrate includes an off-screen camera region including a plurality of opening regions;
  a flexible layer, located at a side of the substrate, where an orthographic projection of the flexible layer on the substrate is not overlapped with the opening regions;
  a backplate layer, located at a side of the flexible layer away from the substrate and including a plurality of light-transmitting film layers, where an orthographic projection of at least one light-transmitting film layer on the substrate covers the opening regions; and
  a light-emitting device layer, located at a side of the backplate layer away from the substrate and including a plurality of cathodes, where orthographic projections of the cathodes on the substrate are not overlapped with the opening regions.

Optionally, the backplate layer includes: a first light-transmitting film layer, an active layer, a second light-transmitting film layer, a plurality of gate electrodes, a third light-transmitting film layer, a plurality of source and drain electrodes, a fourth light-transmitting film layer, a fifth light-transmitting film layer, a plurality of anodes, a sixth light-transmitting film layer and a seventh light-transmitting film layer, which are stacked in sequence on the flexible layer;
  where the first light-transmitting film layer, the second light-transmitting film layer, the third light-transmitting film layer, and the fourth light-transmitting film layer are inorganic film layers; and the fifth light-transmitting film layer, the sixth light-transmitting film layer and the seventh light-transmitting film layer are organic film layers.

Optionally, in the opening regions, the substrate is covered by one or more of the fifth light-transmitting film layer, the sixth light-transmitting film layer and the seventh light-transmitting film layer.

Optionally, in the opening regions, the substrate is covered by one or more of the first light-transmitting film layer, the second light-transmitting film layer, the third light-transmitting film layer and the fourth light-transmitting film layer.

Optionally, in the opening regions, the substrate is covered by one or more of the first light-transmitting film layer, the second light-transmitting film layer, the third light-transmitting film layer, the fourth light-transmitting film layer, the fifth light-transmitting film layer, the sixth light-transmitting film layer and the seventh light-transmitting film layer.

Optionally, the light-emitting device layer includes: an organic light-emitting layer, a plurality of cathodes, a light coupling layer, and a light extraction layer stacked in sequence;
  where orthographic projections of the organic light-emitting layer, the light coupling layer, and the light extraction layer on the substrate cover the opening regions respectively; and orthographic projections of the cathodes on the substrate are partially overlapped with the orthographic projection of the flexible layer on the substrate.

Optionally, the display panel further includes an encapsulation layer, located at a side of the light-emitting device layer away from the substrate, where an orthographic projection of the encapsulation layer on the substrate covers the off-screen camera region.

A second aspect of the present disclosure provides a display apparatus, including a display panel;
  where the display panel including a substrate, where the substrate includes an off-screen camera region including an opening regions; a flexible layer, located at a side of the substrate, where an orthographic projection of the flexible layer on the substrate is not overlapped with the opening regions; a backplate layer, located at a side of the flexible layer away from the substrate and including a plurality of light-transmitting film layers, where an orthographic projection of at least one light-transmitting film layer on the substrate covers the opening regions; and a light-emitting device layer, located at a side of the backplate layer away from the substrate and including a plurality of cathodes, where orthographic projections of the cathodes on the substrate are not overlapped with the opening regions.

Optionally, the backplate layer includes: a first light-transmitting film layer, an active layer, a second light-transmitting film layer, a plurality of gate electrodes, a third light-transmitting film layer, a plurality of source and drain electrodes, a fourth light-transmitting film layer, a fifth light-transmitting film layer, a plurality of anodes, a sixth light-transmitting film layer and a seventh light-transmitting film layer, which are stacked in sequence on the flexible layer;
  where the first light-transmitting film layer, the second light-transmitting film layer, the third light-transmitting film layer, and the fourth light-transmitting film layer are inorganic film layers; and the fifth light-transmitting film layer, the sixth light-transmitting film layer and the seventh light-transmitting film layer are organic film layers.

Optionally, in the opening regions, the substrate is covered by one or more of the fifth light-transmitting film layer, the sixth light-transmitting film layer and the seventh light-transmitting film layer.

Optionally, in the opening regions, the substrate is covered by one or more of the first light-transmitting film layer, the second light-transmitting film layer, the third light-transmitting film layer and the fourth light-transmitting film layer.

Optionally, in the opening regions, the substrate is covered by one or more of the first light-transmitting film layer, the second light-transmitting film layer, the third light-transmitting film layer, the fourth light-transmitting film layer, the fifth light-transmitting film layer, the sixth light-transmitting film layer and the seventh light-transmitting film layer.

Optionally, the light-emitting device layer includes: an organic light-emitting layer, a plurality of cathode, a light coupling layer, and a light extraction layer stacked in sequence;

where orthographic projections of the organic light-emitting layer, the light coupling layer, and the light extraction layer on the substrate cover the opening regions respectively; and orthographic projections of the cathodes on the substrate are partially overlapped with the orthographic projection of the flexible layer on the substrate.

Optionally, the display apparatus further includes an encapsulation layer, located at a side of the light-emitting device layer away from the substrate, where an orthographic projection of the encapsulation layer on the substrate covers the off-screen camera region.

A third aspect of the present disclosure provides a method of preparing a display panel, including:

providing a substrate, where the substrate includes an off-screen camera region including a plurality of opening regions;

preparing a flexible layer and a backplate layer in sequence on the substrate, where the backplate layer includes a plurality of light-transmitting film layers, an orthographic projection of the flexible layer on the substrate is not overlapped with the opening regions, and an orthographic projection of at least one light-transmitting film layer on the substrate covers the opening regions; and preparing a light-emitting device layer on the backplate layer, where the light-emitting device layer includes a plurality of cathodes, and orthographic projections of the cathodes on the substrate are not overlapped with the opening regions.

Optionally, preparing the flexible layer and the backplate layer in sequence on the substrate includes:

preparing the flexible layer on the substrate; and preparing a buffer layer, an active layer, a gate insulation layer, a plurality of gate electrodes, an inter-layer insulation layer, a plurality of source and drain electrodes, a passivation layer, a planarization layer, a plurality of anodes, a pixel defining layer and a photo spacer layer in sequence by patterning process;

where in the opening regions, at least one of the buffer layer, the gate insulation layer, the inter-layer insulation layer or the passivation layer is prepared on the substrate; or, in the opening regions, at least one of the planarization layer, the pixel defining layer or the photo spacer layer is prepared on the substrate; or, in the opening regions, at least one of the buffer layer, the gate insulation layer, the inter-layer insulation layer, the passivation layer, the planarization layer, the pixel defining layer or the photo spacer layer is prepared on the substrate.

Optionally, preparing the light-emitting device layer on the backplate layer includes:

preparing an organic light-emitting layer on the backplate layer by patterning process, where the organic light-emitting layer is located in pixel openings of the pixel defining layer;

preparing the cathodes on the organic light-emitting layer by patterning process, where the cathodes correspond one-to-one in position to the anodes and one of the cathodes covers an anode at a corresponding position; and preparing a light coupling layer and a light extraction layer in sequence on the cathodes by patterning process, where the light coupling layer and the light extraction layer correspond in position to the organic light-emitting layer.

Optionally, after the light-emitting device layer is prepared on the backplate layer, the method further includes: preparing an encapsulation layer on the light extraction layer, where the encapsulation layer includes one or more inorganic encapsulation layers and one or more organic encapsulation layers alternately stacked.

Optionally, after the encapsulation layer is prepared on the light extraction layer, the method further includes: separating the substrate and the flexible layer by a laser lift-off process.

Optionally, a lift-off laser energy density is 190 mJ/cm2-210 mJ/cm2 in the laser lift-off process.

BRIEF DESCRIPTION OF DRAWINGS

By reading the detailed descriptions of the following optional embodiments, various other advantages and benefits will become apparent to those skilled in the art. The accompanying drawings herein are used only to show the purpose of the optional embodiments rather than limit the embodiments of the present disclosure. Further, in all accompanying drawings, the same components will be indicated by the same reference numerals.

DETAILED DESCRIPTION

Figure 1:
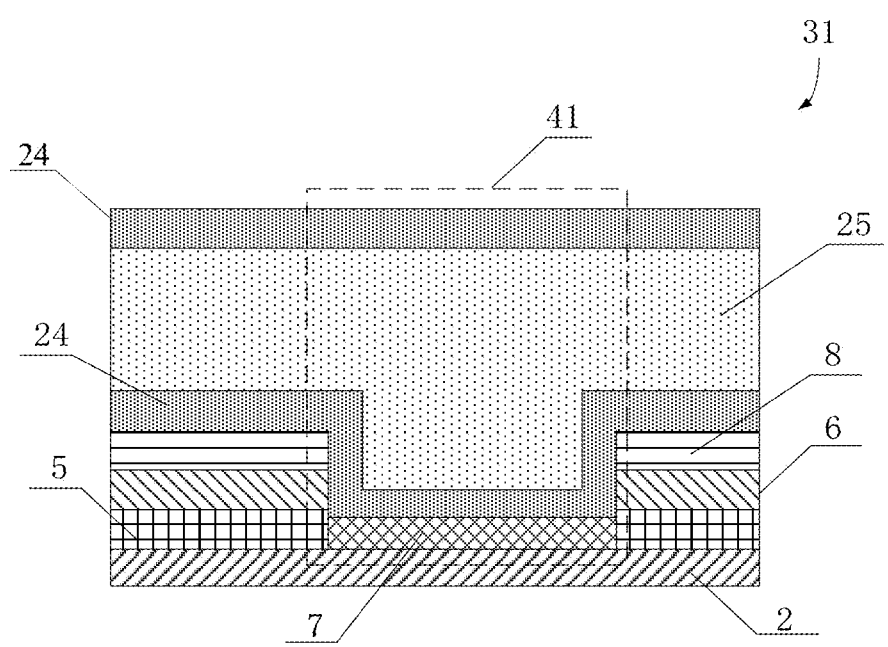
FIG. 1 is a structural diagram of a part of a display panel according to one or more embodiments of the present disclosure.

Exemplary embodiments of the present disclosure will be detailed below by referring to the accompanying drawings. Although the accompanying drawings show the exemplary embodiments of the present disclosure, it should be understood that the present disclosure can be implemented in various forms and shall not be limited to the described embodiments. On the contrary, these embodiments are provided for understanding the present disclosure more thoroughly and conveying the scope of the present disclosure to those skilled in the art completely.

Those skilled in the art may understand that, unless otherwise stated, the terms such as "one" "a", "said" and "the" and the like in the singular form may include plural. It should be further understood that the word "include" used in the specification of the present disclosure refers to presence of the feature, integer, step, operation, element and/or component and does not preclude presence or addition of one or more other features, integers, steps, operations, elements, components and/or their combinations. It should be understood that the word "and/or" used herein includes all or any one unit or all combinations of one or more associated listed items.

Those skilled in the art may understand that unless otherwise defined, all technical terms used herein (including technical terms and scientific terms) have general meanings that can be understood by those skilled in the art. It should be further understood that those terms defined in a common dictionary shall be understood as having the meanings consistent with the meanings in the context of the related arts, and will not be explained ideally or too formally unless otherwise specifically defined herein.

A preparation process of a display panel applicable to and compatible with an off-screen camera in related arts will be firstly detailed below.

Firstly, a flexible layer is prepared on a glass substrate, where the flexible layer may be a polyimide film (PI). Next, a backplate layer is prepared on the flexible layer, where the backplate layer includes a buffer layer, a light blocking layer, an active layer, a first gate insulation layer, a first gate electrode, a second gate insulation layer, a second gate electrode, an inter-layer insulation layer, a first source/drain electrode, a passivation layer, a first planarization layer, a second source/drain electrode, a second planarization layer, a plurality of anodes, a pixel defining layer and a photo spacer layer. The specific preparation method of various film layers included in backplate layer may be referred to related arts and will not be repeated herein. Further, after all film layers of the backplate layer are prepared, part of a portion corresponding to the off-screen camera that is not configured to display is to be etched by one-time gas etching method so as to form opening regions (AA Holes) through which the glass substrate is exposed.

Next, a light-emitting device layer and an encapsulation layer are prepared normally. The light-emitting device layer includes a hole transport layer, an organic light-emitting layer, an electron transport layer, a cathode, a light coupling layer, and a light extraction layer/capping layer. The cathode is made of metal material and has a low transmittance. The specific preparation method of various film layers included in the light-emitting device layer may be referred to related arts and will not be repeated herein. The encapsulation layer includes one or more inorganic encapsulation layers and one or more organic encapsulation layers prepared by alternately stacking. The one or more inorganic encapsulation layers are usually prepared by chemical vapor deposition and the one or more organic encapsulation layers are usually prepared by ink jet printing, and the preparation method thereof may be referred to related arts and will not be repeated herein.

Next, laser lift-off process is performed. The purpose of laser lift-off process is to separate the rigid glass substrate from the flexible layer. When laser scanning is performed in a laser lift-off process, laser lift-off is performed for the light-emitting device layer at the position of the opening regions by using high energy laser. When laser lift-off is performed for the light-emitting device layer, laser is irradiated to a backside of the display panel to lift off the light-emitting device layer. During this lift-off, the hole transport layer, the organic light-emitting layer, the electron transport layer and the cathodes are removed while the light coupling layer and the light extraction layer/capping layer may not be removed. There is a risk of incomplete removal, for example, part of the light-emitting device layer at the opening regions may still be bonded to the glass panel.

The inventor of the present disclosure finds that there are following disadvantages with the preparation process of the display panel compatible with an off-screen camera in the related arts.

Firstly, when laser lift-off is performed for the light-emitting device layer at the opening regions, because cathode which requires high laser energy density for removal is present in the opening regions and high laser energy density may cause other regions around the opening regions to receive large amount of energy, more ashing residues will be produced at the opening regions and regions around the opening regions, affecting the transmittance of the display panel.

Secondly, due to the risk of incomplete removal of part of the light-emitting device layer at the opening regions in a laser lift-off process, tearing occurring when the glass substrate is removed subsequently may cause a film layer at the position of the light-emitting device layer not completely removed to be peeled off.

Thirdly, due to large depth of AA holes in the opening regions, it is difficult to level the organic encapsulation layer in the preparation process of the encapsulation layer, affecting the normal process.

The embodiments of the present disclosure provide a display panel and a preparation method thereof to solve the above disadvantages of the related arts.

The display panel according to one or more embodiments of the present disclosure will be detailed below in combination with accompanying drawings.

Figure 2:
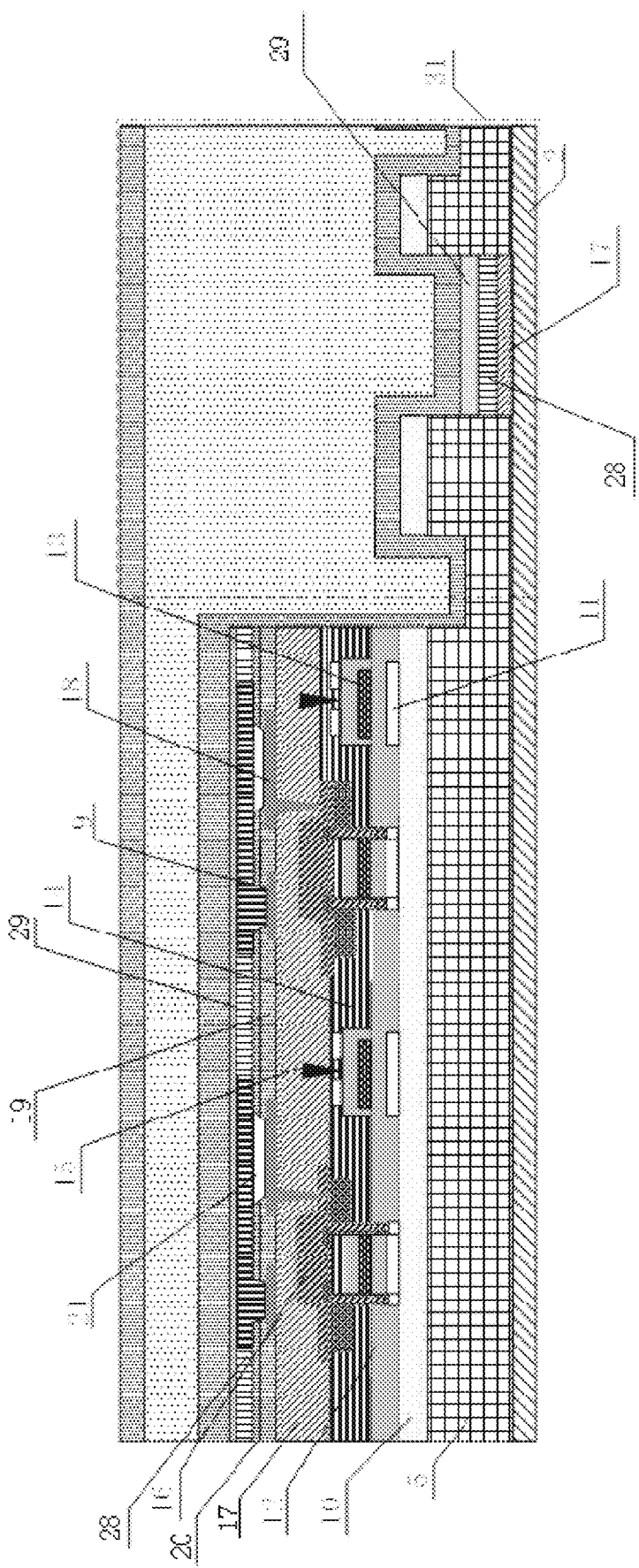
FIG. 2 is a structural schematic diagram of a display panel according to one or more embodiments of the present disclosure.
Figure 3:
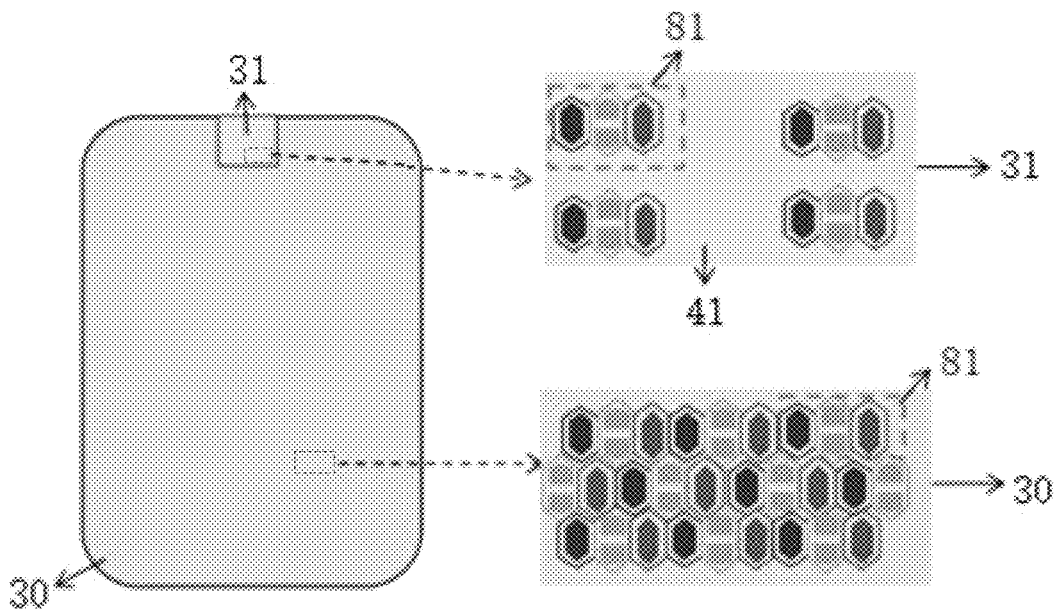
FIG. 3 is a structural schematic diagram of pixels of a display panel according to one or more embodiments of the present disclosure.

The embodiments of the present disclosure provide a display panel. As shown in FIGS. 1-3, the display panel includes a substrate 2 including an off-screen camera region 31, and the off-screen camera region 31 includes a plurality of opening regions 41. The disposal positions of the opening regions 41 in the embodiments of the present disclosure are similar to related arts as long as the opening regions 41 are disposed in the off-screen camera region 31. Therefore, the positions of the opening regions 41 are not limited in the embodiments of the present disclosure.

As shown in FIGS. 1-2, the display panel 1 in the embodiments of the present disclosure may further include: a flexible layer 5, a backplate layer 6 and a light-emitting device layer 8. The flexible layer 5 is located at a side of the substrate 2 and an orthographic projection of the flexible layer 5 on the substrate 2 is not overlapped with the opening regions 41, that is, the flexible layer 5 does not cover the substrate 2 at the position of the opening regions 41. The backplate layer is located at a side of the flexible layer 5 away from the substrate 2 and includes a plurality of light-transmitting film layers (only one light-transmitting film layer is shown in FIG. 1), and an orthographic projection of at least one light-transmitting film layer 7 on the substrate 2 covers the opening regions 41. The at least one light-transmitting film layer may also cover part or all of the display region apart from the opening region 41. FIG. 1 only shows that the light-transmitting film layer 7 covers the opening regions 41. The light-emitting device layer 8 is located at a side of the backplate layer 6 away from the substrate 2, and includes a plurality of cathodes 9. An orthographic projection of the cathodes 9 on the substrate 2 is not overlapped with the opening regions 41, that is, there is no the cathode 9 at the position of the opening regions 41.

In the embodiments of the present disclosure, the substrate 2 may be a glass substrate, the flexible layer 5 may be a PI film layer, the specific film layer of the light-transmitting film layer 7 included in the backplate layer 6 will be introduced below, and the cathodes 9 are made of metal material.

In the display panel according to the embodiments of the present disclosure, the orthographic projection of at least one light-transmitting film layer 7 on the substrate 2 covers the opening regions 41. Compared with through holes in related arts, holes corresponding to the opening regions 41 are a blind holes, the disposal of the light-transmitting film layer 7 at the opening regions 41 enables the holes at the opening regions 41 to become shallow. In this case, in a subsequent encapsulation process, the organic encapsulation layer will be easier to level. Furthermore, the light-transmitting film layer 7 is disposed at the opening regions 41 such that the light-emitting device layer 8 will not be in direct contact with the substrate 2 in spite of incomplete removal in a laser lift-off process. In this way, the problem that removal of the substrate 2 subsequently brings a risk of film layer peeling is avoided. In addition, in the embodiments of the present disclosure, the orthographic projection of the cathodes 9 on the substrate 2 is not overlapped with the opening regions 41. Therefore, compared with related arts, the cathodes 9 are not to be removed in a laser lift-off process. Thus, in the laser lift-off process, the flexible layer 5 and the substrate 2 may be separated using a laser energy density lower than related arts, effectively avoiding ashing residues caused by higher laser energy density, and improving the transmittance of the display panel.

As shown in FIG. 3, the display panel in the embodiments of the present disclosure includes a display region 30 which surrounds the off-screen camera region 31. The off-screen camera region 31 is a low density pixel region, that is, a density of pixel units 81 disposed in the off-screen camera region 31 is lower than a density of pixel units 81 disposed in the display region 30. Each pixel unit 81 includes a red pixel unit, a blue pixel unit, and a green pixel unit.

Optionally, continuing referring to FIG. 2, the backplate layer 6 in the embodiments of the present disclosure includes: a first light-transmitting film layer 10, an active layer 11, a second light-transmitting film layer 12, a plurality of gate electrodes 13, a third light-transmitting film layer 14, source and drain electrodes 15, a fourth light-transmitting film layer 16, a fifth light-transmitting film layer 17, anodes 18, a sixth light-transmitting film layer 19 and a seventh light-transmitting film layer 20, which are stacked in sequence on the flexible layer 5. The first light-transmitting film layer 10, the second light-transmitting film layer 12, the third light-transmitting film layer 14, and the fourth light-transmitting film layer 16 are inorganic layers; and the fifth light-transmitting film layer 17, the sixth light-transmitting film layer 19 and the seventh light-transmitting film layer 20 are organic layers.

In the embodiments of the present disclosure, the first light-transmitting film layer 10 is a buffer layer, the second light-transmitting film layer 12 is a gate insulation layer, the third light-transmitting film layer 14 is an inter-layer insulation layer, the fourth light-transmitting film layer 16 is a passivation layer, the fifth light-transmitting film layer 17 is a planarization layer, the sixth light-transmitting film layer 19 is a pixel defining layer, and the seventh light-transmitting film layer 20 is a photo spacer layer.

In an optional embodiment, in the opening regions 41, the substrate 2 is covered by one or more of the fifth light-transmitting film layer 17, the sixth light-transmitting film layer 19 and the seventh light-transmitting film layer 20, that is, the opening regions 41 of the substrate 20 may be covered only by the organic layer.

In another optional embodiment, in the opening regions 41, the substrate 2 is covered by one or more of the first light-transmitting film layer 10, the second light-transmitting film layer 12, the third light-transmitting film layer 14 and the fourth light-transmitting film layer 16, that is, the opening regions 41 of the substrate 2 may be covered only by the inorganic layer.

In another optional embodiment, in the opening regions 41, the substrate 2 is covered by one or more of the first light-transmitting film layer 10, the second light-transmitting film layer 12, the third light-transmitting film layer 14, the fourth light-transmitting film layer 16, the fifth light-transmitting film layer 17, the sixth light-transmitting film layer 19 and the seventh light-transmitting film layer 20. That is, in the opening regions 41, the substrate 2 may be covered by both the inorganic layer and the organic layer. For example, in the opening regions 41, the substrate 2 is covered by the fourth light-transmitting film layer 16, the sixth light-transmitting film layer 19 and the seventh light-transmitting film layer 20.

Optionally, as shown in FIG. 2, the light-emitting device layer 8 in the embodiments of the present disclosure includes an organic light-emitting layer 21, a plurality of cathodes 9, a light coupling layer 28, and a light extraction layer/capping layer 29 stacked in sequence. Orthographic projections of the light coupling layer 28 and the light extraction layer 29 on the substrate 2 both cover the opening regions 41. Orthographic projections of the cathodes 9 on the substrate 2 are partially overlapped with an orthographic projection of the flexible layer 5 on the substrate 2.

It is to be noted that in the embodiments of the present disclosure, the cathodes 9 are patterned cathodes and do not cover the entire substrate 2, the position of the patterned cathodes corresponds to the position of the plurality of anodes, that is, a patterned cathode 9 is exactly above an anode 18 and has a slightly larger area than the anode.

Further, as shown in FIGS. 1 and 2, the display panel further includes an encapsulation layer. The encapsulation layer is located at a side of the light-emitting device layer 8 away from the substrate 2, and an orthographic projection of the encapsulation layer on the substrate 2 covers the off-screen camera region 31. The disposal of the encapsulation layer in the embodiments of the present disclosure is similar to related arts. FIGS. 1 and 2 only show two inorganic encapsulation layers 24 and one organic encapsulation layer 25. Because the hole depth at the position of the opening regions 41 in the embodiments of the present disclosure is smaller than the hole depth at the opening regions in the related arts, it is easier to level the organic encapsulation layer 25 when the organic encapsulation layer 25 is formed, further ensuring normal process.

Furthermore, the inventor of the present disclosure obtains the data in Table 1 by comparing the display panel compatible with off-screen camera in the related arts with the display panel in the embodiments of the present disclosure in terms of lift-off laser energy density, ashing amount of entire display panel after laser lift-off and transmittance of display panel.

as the above display panel. Therefore, the beneficial effects of the display apparatus will no longer be described.

Figure 4:
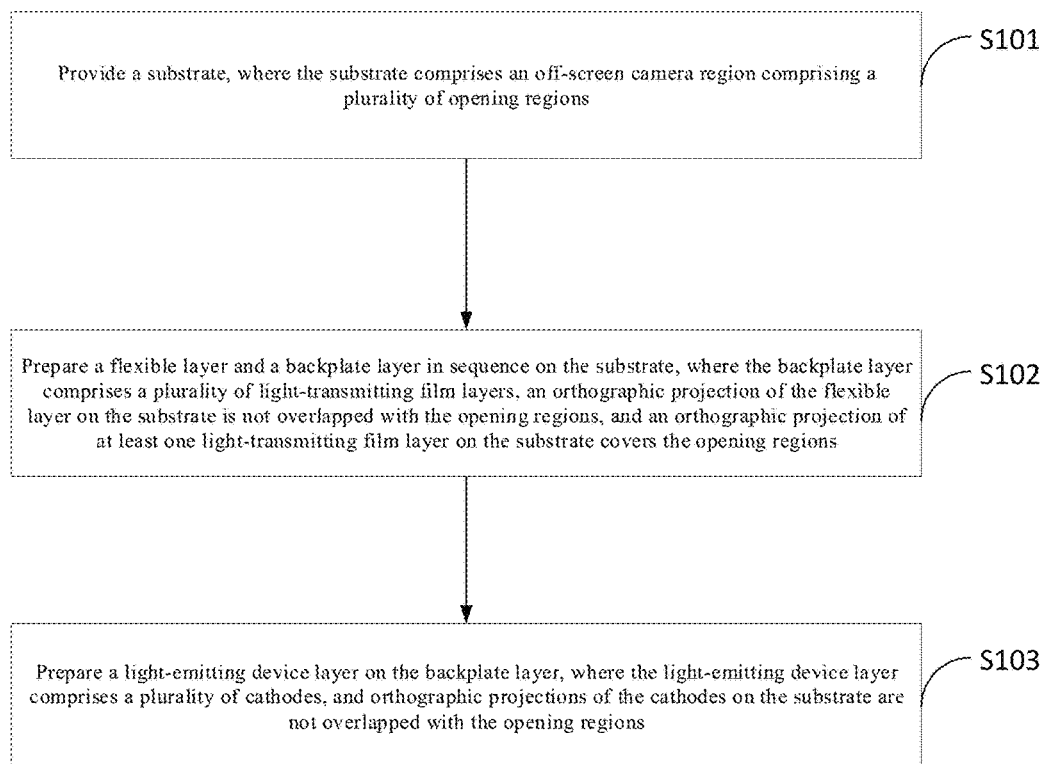
FIG. 4 is a flowchart of a method of preparing a display panel according to one or more embodiments of the present disclosure.

Based on the same invention concept, one or more embodiments of the present disclosure provide a method of preparing a display panel. As shown in FIG. 4, the preparation method includes the following steps.

At step S101, a substrate 2 is provided, where the substrate 2 includes an off-screen camera region 31 including a plurality of opening regions 41.

At step 102, a flexible layer 5 and a backplate layer 6 are prepared in sequence on the substrate 2, where the backplate layer 6 includes a plurality of light-transmitting film layers 7, an orthographic projection of the flexible layer 5 on the substrate 2 is not overlapped with the opening regions 41, and an orthographic projection of at least one light-transmitting film layer 7 on the substrate 2 covers the opening regions 41.

At step S103, a light-emitting device layer 8 is prepared on the backplate layer 6, where the light-emitting device layer 8 includes a plurality of cathodes 9, and orthographic projections of the cathodes 9 on the substrate 2 are not overlapped with the opening regions 41.

In the embodiments of the present disclosure, the flexible layer 5 and the backplate layer 6 are prepared in sequence on

TABLE 1

| Film layer structure of off-screen camera opening regions 41 | | | |
|---|---|---|---|
| Encapsulation layer + EV cathode (conventional film layer structure) | Encapsulation layer + organic layer | Encapsulation layer + inorganic layer | Encapsulation layer + inorganic layer + organic layer |
| Lift-off laser energy density | 270-280 mJ/cm$^2$ | 190-195 mJ/cm$^2$ | 200-210 mJ/cm$^2$ | 200-210 mJ/cm$^2$ |
| Ashing amount | largest | normal | normal | normal |
| Transmittance | low | high | high | high |

As can be seen from the Table 1, compared with the conventional display panel, when performing laser lift-off process, lift-off laser energy density applied to the display panel 1 in the embodiments of the present disclosure reduces to 190-210 mJ/cm$^2$ from 270-280 mJ/cm$^2$; the ashing amount reduces, that is, the ashing amount changes from plenty to normal. In the embodiments of the present disclosure, the ashing amount produced by laser irradiation is basically invisible to eyes and can be seen through a microscope. Therefore, compared with the visible ashing amount produced by laser irradiation in the related arts, the ashing amount produced in the embodiments of the present disclosure almost does not affect the transmittance of the display panel, which is proved by the transmittance result in Table 1. Further, compared with the transmittance of the conventional display panel, the transmittance of the display panel in the embodiments of the present disclosure is significantly improved. In a laser lift-off process, the flexible layer 5 can be separated from the substrate 2 by using a laser energy density lower than the laser energy density in the related arts (for example, the lift-off laser energy density adopted in the related arts is 270-280mJ/cm$^2$, while the lift-off laser energy density adopted in the embodiments of the present disclosure is 190-210 mJ/cm$^2$).

Based on the same invention concept, one or more embodiments of the present disclosure further provide a display apparatus including the above display panel. Because the display apparatus includes the above display panel, the display apparatus has the same beneficial effects the substrate 2. The backplate layer 6 includes a plurality of light-transmitting film layers 7. The orthographic projection of the flexible layer 5 on the substrate 2 is not overlapped with the opening regions 41, and the orthographic projection of at least one light-transmitting film layer 7 on the substrate 2 covers the opening regions 41. Compared with through holes in related arts, holes corresponding to the opening regions 41 are blind holes, and the blind holes are smaller in depth than the through holes. In a subsequent encapsulation process, the organic encapsulation layer will be easier to level. Furthermore, the orthographic projections of the cathodes 9 on the substrate 2 are not overlapped with the opening regions 41, that is, there is no cathode 9 at the position of the opening regions 41. In a laser lift-off process, it is not required to remove the cathode 9. Thus, in the laser lift-off process, the flexible layer 5 and the substrate 2 may be separated using a laser energy density lower than related arts, effectively avoiding ashing residues caused by higher laser energy density, and improving the transmittance of the display panel.

Optionally, in the embodiments of the present disclosure, at the step S102, preparing the flexible layer 5 and the backplate layer 6 in sequence on the substrate 2 includes the following steps.

At step S1021, the flexible layer 5 is prepared on the substrate 2. In the embodiments of the present disclosure, the substrate 2 may be a glass substrate and the flexible layer 5 may be a polyimide (PI) film layer. The glass substrate is washed clean before the flexible layer 5 is prepared. The preparation method of the flexible layer 5 is similar to the related arts and will not be repeated herein.

At step S1022, the buffer layer, the active layer 11, the gate insulation layer 12, the gate electrodes 13, the inter-layer insulation layer, the source and drain electrodes 15, the passivation layer, the planarization layer, the anodes, the pixel defining layer and the photo spacer layer are prepared in sequence by patterning process on the structure prepared at step S1021. In the opening regions 41, at least one of the buffer layer, the gate insulation layer, the inter-layer insulation layer or the passivation layer is prepared on the substrate 2; or, in the opening regions 41, at least one of the planarization layer, the pixel defining layer or the photo spacer layer is prepared on the substrate 2; or, in the opening regions 41, at least one of the buffer layer, the gate insulation layer, the inter-layer insulation layer, the passivation layer, the planarization layer, the pixel defining layer or the photo spacer layer is prepared on the substrate 2.

The preparation process of the above step S1022 in the embodiment of the present disclosure will be described below in detail in combination with FIGS. 5-16. The region shown in FIGS. 5-16 is the off-screen camera region 31.

Figure 5:
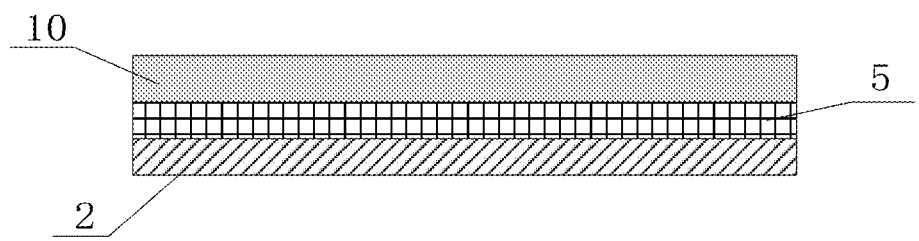
FIG. 5 shows a flexible layer and a first light-transmitting film layer disposed on a substrate.

In an embodiment of the present disclosure, only organic layer is prepared in the opening regions 41. As shown in FIG. 5, the first light-transmitting film layer 10 is firstly prepared on the flexible layer 5. In one or more embodiments, the first light-transmitting film layer 10 is a buffer layer which may be one insulation film layer or a plurality of insulation film layers in the embodiment of the present disclosure. For example, the buffer layer may be a silicon oxide film layer or a film layer formed by silicon oxide and silicon nitride.

Figure 6:
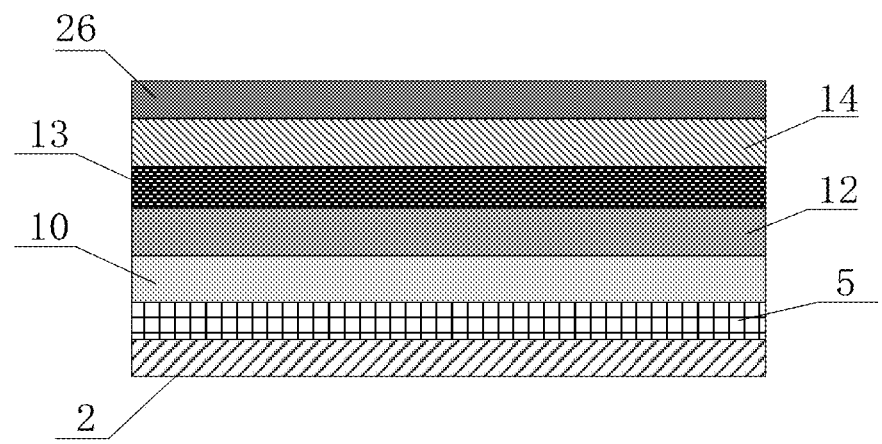
FIG. 6 is a structural schematic diagram after preparing an active layer, a second light-transmitting film layer, a gate electrode, a third light-transmitting film layer and a photoresist on the structure shown in FIG. 5.

Next, as shown in FIG. 6, the active layer 11 (not shown in FIG. 6, please refer to FIG. 3 for its position), the second light-transmitting film layer 12, the gate electrodes 13, the third light-transmitting film layer 14 are prepared in sequence at a side of the first light-transmitting film layer away from the flexible layer 5 by patterning process, and then, photoresist is coated on the third light-transmitting film layer 14. In one or more embodiments, the second light-transmitting film layer 12 is a gate insulation layer, the third light-transmitting film layer 14 is an inter-layer insulation layer, and the materials of the gate insulation layer and the inter-layer insulation layer may be the same.

Figure 7:
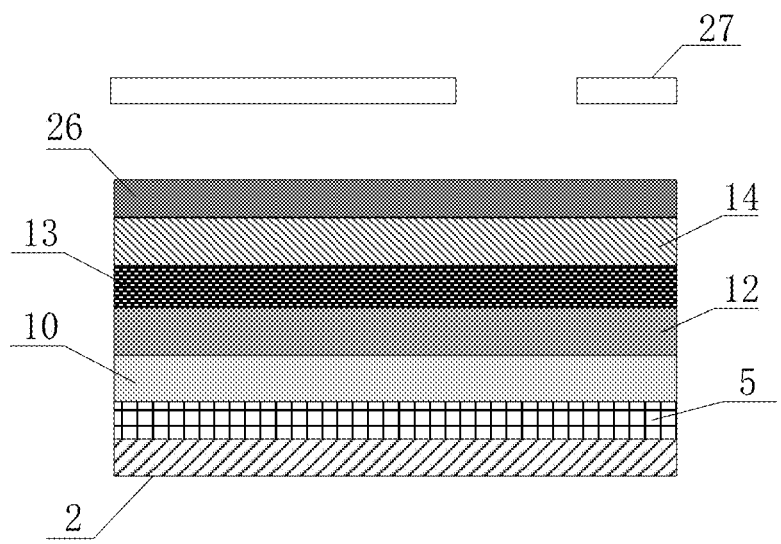
FIG. 7 is a structural schematic diagram when exposure procedure is performed for the structure shown in FIG. 6.

Next, as shown in FIG. 7, the photoresist 26 is exposed using a mask 27. During implementation, the photoresist 26 adopted in the embodiment of the present disclosure may be a positive photoresist, the mask 27 includes light-transmitting regions and light-blocking regions, and the positions of the light-transmitting regions correspond to the positions of the opening regions 41 to be formed. After exposure, developing is performed to remove the photoresist at the positions corresponding to the opening regions 41 and retain the photoresist at remaining positions.

Figure 8:
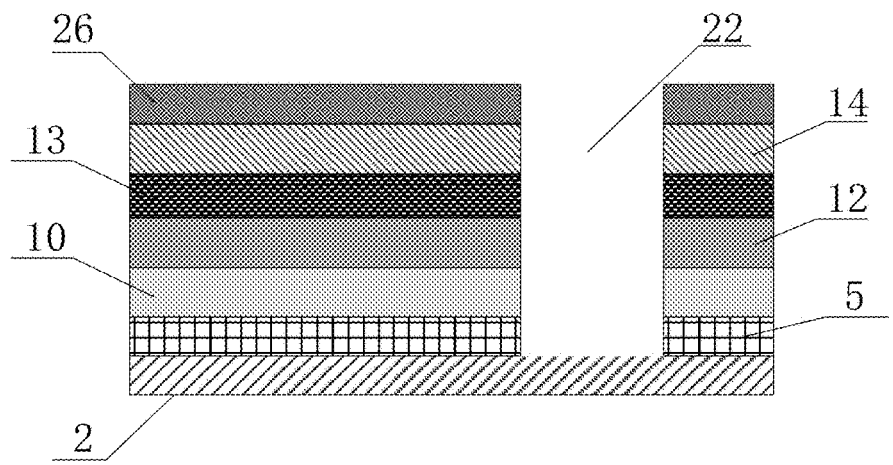
FIG. 8 is a structural schematic diagram after exposure procedure is performed for the structure shown in FIG. 6.
Figure 9:
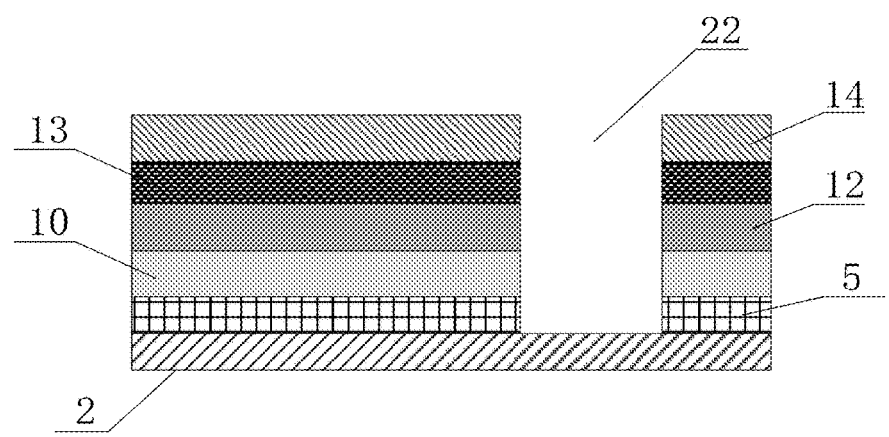
FIG. 9 is a structural schematic diagram after the photoresist shown in FIG. 8 is removed.

Next, as shown in FIG. 8, a plurality of first vias 22 penetrating through the flexible layer 5, the first light-transmitting film layer 10, the second light-transmitting film layer 12, the gate electrodes 13 and the third light-transmitting film layer 14 are formed by etching with the photoresist as mask. The vias expose the substrate 2. Then, the remaining photoresist is removed by adopting a stripping process as shown in FIG. 9.

In an embodiment of the present disclosure, the flexible layer 5 may be a single-layer PI film layer with a transmittance being about 74.8%. In this way, it is guaranteed that the flexible layer 5 can be fully etched when forming the first vias by etching. In addition, in the embodiment of the present disclosure, the inter-layer insulation layer has a thickness of 5000 Å-8000 Å. The thickness of the inter-layer insulation layer in the embodiments of the present disclosure is larger than a thickness (2000 Å-3000 Å) of the inter-layer insulation layer in the related arts. The increased thickness of the inter-layer insulation layer can effectively prevent etching gas from damaging the film layer under the photoresist 26 at the time of etching to form the first vias.

Figure 10:
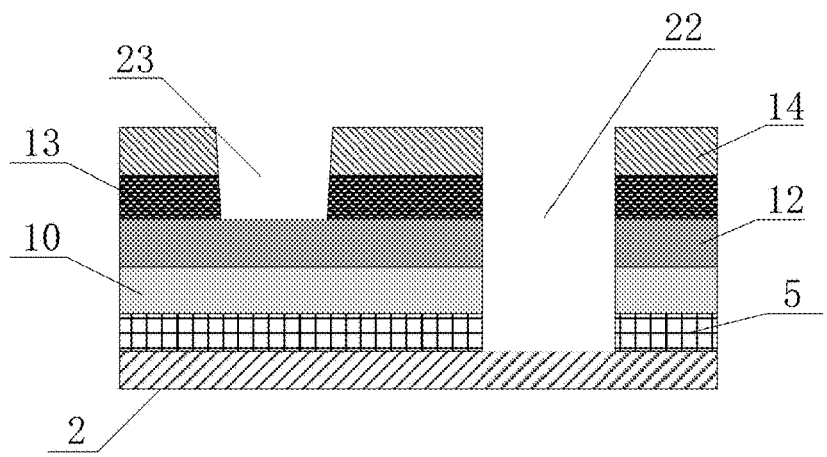
FIG. 10 is a structural schematic diagram after a via is disposed in the structure shown in FIG. 9.

Next, as shown in FIG. 10, a plurality of second vias 23 are prepared by patterning process. The patterning process herein includes coating photoresist, exposing, developing, etching and removing photoresist. The preparation method of the second vias 23 is similar to related arts and will not be repeated herein. The second vias 23 are to expose the active layer so that the source and drain electrodes prepared subsequently can be connected with the active layer.

Figure 11:
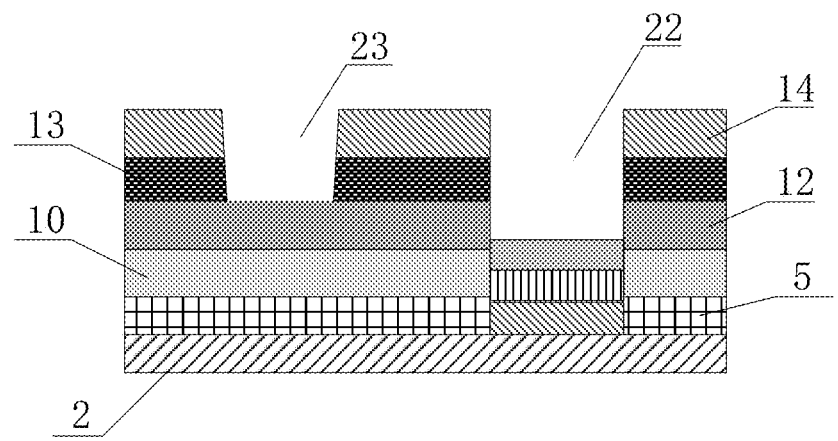
FIG. 11 is a structural schematic diagram after a fifth light-transmitting film layer, a sixth light-transmitting film layer and a seventh light-transmitting film layer are disposed on the structure shown in FIG. 10.

Next, as shown in FIG. 11, the source and drain electrodes (not shown in FIG. 11), the passivation layer (not shown in FIG. 11), the fifth light-transmitting film layer 17, the anodes (not shown in FIG. 11), the sixth light-transmitting film layer 19 and the seventh light-transmitting film layer 20 are prepared in sequence by patterning process on the structure shown in FIG. 10. The fifth light-transmitting film layer 17 is a planarization layer, the sixth light-transmitting film layer 19 is a pixel defining layer, and the seventh light-transmitting film layer 20 is a photo spacer layer. During the preparation process, at least one of the planarization layer, the pixel defining layer or the photo spacer layer is filled in the first vias 22 by patterning process. FIG. 11 shows a case in which the first vias 22 is filled with the planarization layer, the pixel defining layer and the photo spacer layer. FIG. 11 shows the planarization layer, the pixel defining layer and the photo spacer layer are filled only in the first vias 22. The disposal of the planarization layer, the pixel defining layer and the photo spacer layer in positions other than the first vias 22 is similar to the related arts and will not be repeated herein.

It should be noted that the preparation of the backplate layer in the embodiments of the present disclosure is described with preparation of one layer of gate electrode and one layer of source and drain electrode as an example. In an actual preparation process, two layers of gate electrodes and two layers of source and drain electrodes may be prepared. The preparation method of the two layers of gate electrodes and the two layers of source and drain electrodes is similar to related arts and will not be repeated herein.

Figure 12:
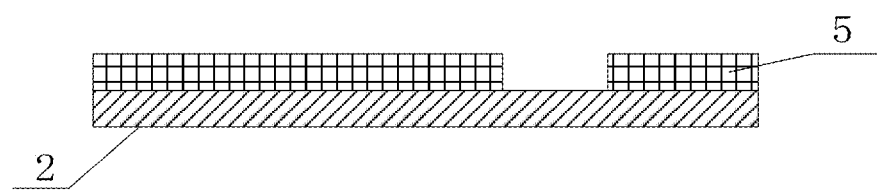
FIG. 12 is a structural schematic diagram of a via prepared in a structure formed by disposing a flexible layer on a substrate.

In another embodiment, only inorganic layer is prepared in the opening regions 41. As shown in FIG. 12, a plurality of third vias are prepared in the flexible layer 5 by patterning process, and the third vias correspond in position to the opening regions 41. The patterning process herein includes part or all of coating photoresist, exposing, developing, etching, and removing photoresist.

Figure 13:
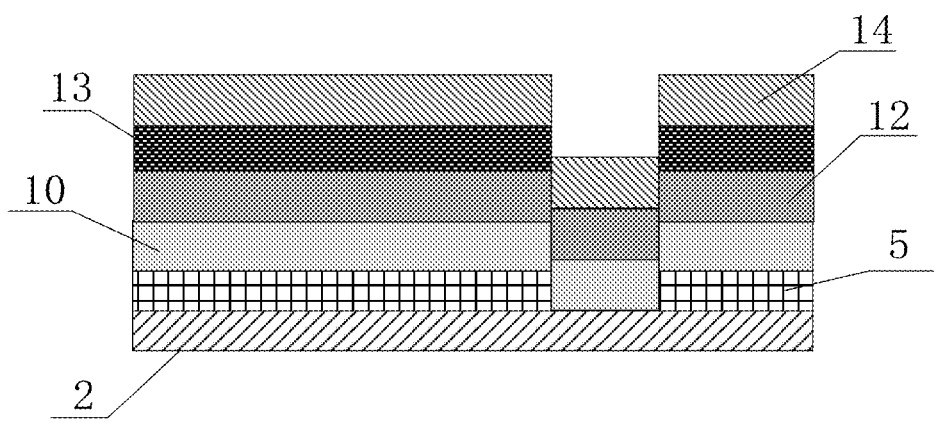
FIG. 13 is a structural schematic diagram after a first light-transmitting film layer, a second light-transmitting film layer, a gate electrode, and a third light-transmitting film layer are disposed on the structure shown in FIG. 12.

Next, as shown in FIG. 13, the first light-transmitting film layer 10, the active layer 11 (not shown in FIG. 13), the second light-transmitting film layer 12, the gate electrodes 13 and the third light-transmitting film layer 14 are prepared in sequence at a side of the flexible layer 5 away from the substrate 2 by patterning process. It should be guaranteed that the first light-transmitting film layer 10, the second light-transmitting film layer 12, and the third light-transmitting film layer 14 are filled in the third vias by patterning process. The disposal of the first light-transmitting film layer 10, the second light-transmitting film layer 12, and the third light-transmitting film layer 14 in positions other than the third vias is similar to the related arts and will not be repeated herein.

Figure 14:
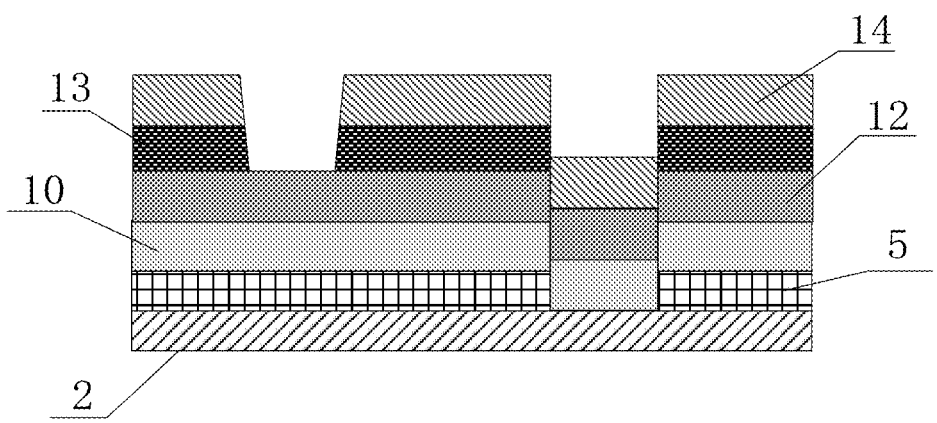
FIG. 14 is a structural schematic diagram after a via is disposed in the structure shown in FIG. 13.

Next, as shown in FIG. 14, the second vias are prepared by patterning process. The preparation method of the second vias is similar to the related arts and will not be repeated herein. The second vias are to expose the active layer so that the source and drain electrode prepared subsequently can be connected with the active layer.

Figure 15:
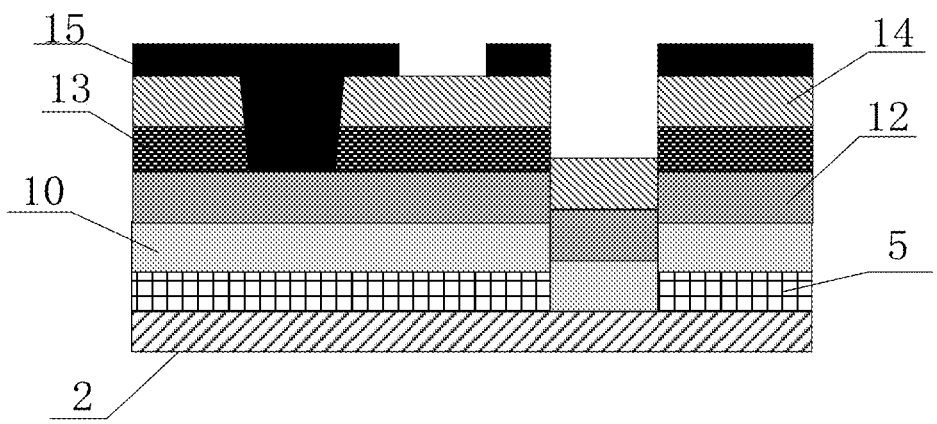
FIG. 15 is a structural schematic diagram after a source/drain electrode is disposed on the structure shown in FIG. 14.

Next, as shown in FIG. 15, the source and drain electrode 15 is prepared at a side of the third light-transmitting film layer 14 away from the gate electrodes 13 by patterning process. The source and drain electrode 15 is connected with the active layer through the second vias. Although the active layer is not shown in FIG. 15, the source and drain electrode 15 in the second vias is in connection with the active layer.

Figure 16:
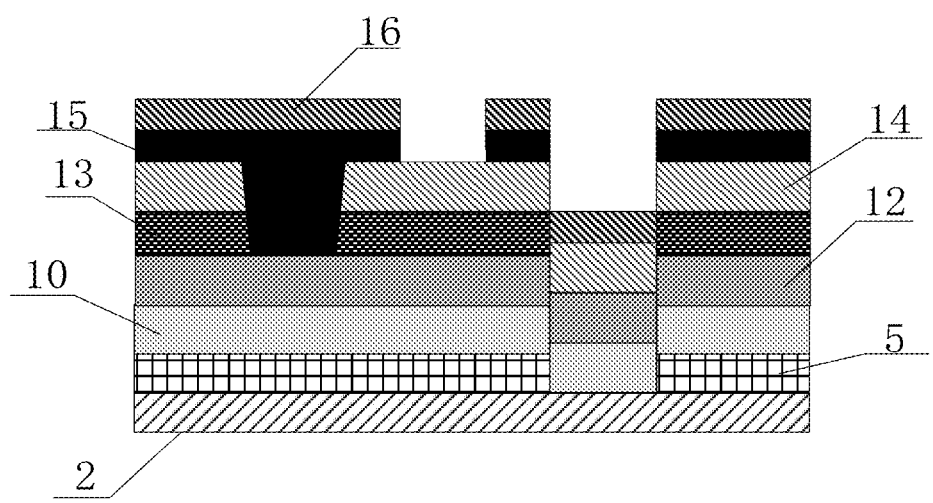
FIG. 16 is a structural schematic diagram after a fourth light-transmitting film layer is disposed on the structure shown in FIG. 15.

Next, as shown in FIG. 16, the fourth light-transmitting film layer 16 is prepared at a side of the source and drain electrode away from the third light-transmitting film layer 14 by patterning process. The fourth light-transmitting film layer 16 is a passivation layer. In an actual preparation, the fourth light-transmitting film layer 16 may also be filled in the third vias by patterning process. FIG. 16 only shows a case that the third vias are filled with the first light-transmitting film layer 10, the second light-transmitting film layer 12, the third light-transmitting film layer 14, and the fourth light-transmitting film layer 16. In actual preparation process, the third vias may be filled with the inorganic layer of first, second or third layer through a different disposal of the mask.

Next, the planarization layer, the anodes, the pixel defining layer and the photo spacer layer are prepared in sequence on the fourth light-transmitting film layer 16 by patterning process. In this step, the planarization layer, the pixel defining layer and the photo spacer layer are not filled in the third vias through different disposals of the mask. In an actual preparation process, the pixel defining layer and the photo spacer layer may be prepared in the same patterning process.

Furthermore, in the embodiments of the present disclosure, filling the organic layer and the inorganic layer in the vias at the position of the opening regions 41 can be achieved through different disposals of the mask and thus will not be repeated herein.

Optionally, in an embodiment of the present disclosure, at the step S103, preparing the light-emitting device layer 8 on the backplate layer 6 includes:
  preparing the organic light-emitting layer 21 on the backplate layer 6 by patterning process, where the organic light-emitting layer 21 is located in pixel openings of the pixel defining layer;
  preparing the cathodes 9 on the organic light-emitting layer 21 by patterning process, where the cathodes 9 corresponds one-to-one in position to the anodes 18 and a cathode covers an anode 18 at the corresponding position;
  preparing the light coupling layer 28 and the light extraction layer 29 in sequence on the cathodes 9 by patterning process, where the light coupling layer 28 and the light extraction layer 29 correspond in position to the organic light-emitting layer 21.

The preparation method of the organic light-emitting layer 21, the light coupling layer 28 and the light extraction layer 29 in preparation is similar to the related arts and will not be repeated herein. Different from the cathode prepared in the form of a continuous planar electrode in the related arts, the cathodes formed in the embodiment of the present disclosure are cathodes patterned by patterning process, and the patterned cathodes do not cover the opening regions 41.

Optionally, in the embodiment of the present disclosure, after the light-emitting device layer 8 is prepared on the backplate layer 6, the method further includes: preparing the encapsulation layer on the light extraction layer 29, where the encapsulation layer includes one or more inorganic encapsulation layers and one or more organic encapsulation layers stacked alternately. The preparation method of the encapsulation layer is similar to the related arts and will not be repeated herein.

Optionally, in the embodiment of the present disclosure, after the encapsulation layer is prepared on the light extraction layer 29, the method further includes: separating the substrate 2 from the flexible layer 5 using a laser lift-off process. In this embodiment, the lift-off laser energy density in the laser lift-off process is 190 mJ/cm$^2$-210 mJ/cm$^2$.

The embodiments of the present disclosure have the following beneficial effects.

In the display panel according to the embodiments of the present disclosure, the orthographic projection of at least one light-transmitting film layer 7 on the substrate 2 covers the opening regions 41. Compared with through holes in the related arts, holes corresponding to the opening regions 41 are blind holes. The disposal of the light-transmitting film layer 7 at the opening regions 41 enables the hole at the opening regions to become shallow. In this case, in a subsequent encapsulation process, the organic encapsulation layer will be easier to level. Furthermore, the light-transmitting film layer 7 is disposed at the opening regions 41 such that the light-emitting device layer 8 is not in direct contact with the substrate 2 in spite of incomplete removal in a laser lift-off process. In this way, the problem that removing the substrate 2 in a removal process subsequently brings a risk of film layer peeling is avoided. In addition, in the embodiments of the present disclosure, the orthographic projections of the cathodes 9 on the substrate 2 are not overlapped with the opening regions 41. Therefore, compared with related arts, the cathodes 9 are not to be removed in a laser lift-off process. Thus, in the laser lift-off process, the flexible layer 5 and the substrate 2 may be separated using a laser energy density lower than related arts, effectively avoiding ashing residues caused by higher laser energy density, and improving the transmittance of the display panel.

Those skilled in the arts may understand that steps, measures and solutions in various operations, methods, and flows that have been discussed in the present disclosure may be alternated, changed, combined or deleted. Further, other steps, measures and solutions having various operations, methods and flows that have been discussed in the present disclosure may also be alternated, changed, re-arranged, decomposed, combined or deleted. Further, steps, measures, and solutions of the related arts having various operations, methods and flows that are disclosed in the present disclosure may also be alternated, changed, re-arranged, decomposed, combined or deleted.

In the descriptions of the present disclosure, it should be understood that orientations or positional relationships indicated by the terms "center", "upper", "lower", "front", "rear", "left", "right", "vertical", "horizontal", "top", "bottom", "inner" and "outer" and the like are based on the orientations or positional relationships indicated by the accompanying drawings and used only to facilitate describing the present disclosure and simplify the descriptions rather than indicate or imply that the indicated apparatus or elements must have a particular orientation or be constructed and operated in a particular orientation and thus shall not be understood as limiting of the present disclosure.

The terms "first" and "second" are used only for the purpose of descriptions and shall not be understood as indicating or implying relative importance or implicitly indicating a number of the indicated technical features. Therefore, those features defined by "first" and "second" may explicitly or implicitly include one or more of the features. In the descriptions of the present disclosure, unless otherwise stated, "plurality" means two or more.

The above descriptions are only about some embodiments of the present disclosure. It should be noted that several improvements and modifications made by those skilled in the arts without departing from the principle of the present disclosure shall all fall within the scope of protection of the present disclosure.

What is claimed is:

1. A display panel, comprising:
a substrate, wherein the substrate comprises an off-screen camera region comprising a plurality of opening regions;
a flexible layer, located at a side of the substrate and provided with a plurality of through holes whose orthographic projections on the substrate coincide with the opening regions so that an orthographic projection of the flexible layer on the substrate is not overlapped with the opening regions, wherein the flexible layer is further provided with a plurality of blind holes that do not completely penetrate the flexible layer and orthographic projections of the plurality of blind holes on the substrate are in the off-screen camera region and not overlapped with the opening regions;
a backplate layer, located at a side of the flexible layer away from the substrate and comprising a plurality of light-transmitting film layers, wherein at least one light-transmitting film layer of the plurality of light-transmitting film layers fully covers the through holes and also covers at least part of a display region of the display panel apart from the through holes and thickness of part of the at least one light-transmitting film layer that fully covers the through holes is basically uniform; wherein the part of the at least one light-transmitting film layer that fully covers the through holes is separated by at least the blind holes from part of the at least one light-transmitting film layer that covers at least part of the display region of the display panel apart from the through holes, and
a light-emitting device layer, located at a side of the backplate layer away from the substrate and comprising a plurality of cathodes, wherein orthographic projections of the cathodes on the substrate are not overlapped with the opening regions.

2. The display panel according to claim 1, wherein the backplate layer comprises: a first light-transmitting film layer, an active layer, a second light-transmitting film layer, a plurality of gate electrodes, a third light-transmitting film layer, a plurality of source and drain electrodes, a fourth light-transmitting film layer, a fifth light-transmitting film layer, a plurality of anodes, a sixth light-transmitting film layer and a seventh light-transmitting film layer, which are stacked in sequence on the flexible layer;
wherein the first light-transmitting film layer, the second light-transmitting film layer, the third light-transmitting film layer, and the fourth light-transmitting film layer are inorganic film layers; and the fifth light-transmitting film layer, the sixth light-transmitting film layer and the seventh light-transmitting film layer are organic film layers.

3. The display panel according to claim 2, wherein in the opening regions, the substrate is covered by one or more of the fifth light-transmitting film layer, the sixth light-transmitting film layer and the seventh light-transmitting film layer.

4. The display panel according to claim 2, wherein in the opening regions, the substrate is covered by one or more of the first light-transmitting film layer, the second light-transmitting film layer, the third light-transmitting film layer and the fourth light-transmitting film layer.

5. The display panel according to claim 2, wherein in the opening regions, the substrate is covered by one or more of the first light-transmitting film layer, the second light-transmitting film layer, the third light-transmitting film layer, the fourth light-transmitting film layer, the fifth light-transmitting film layer, the sixth light-transmitting film layer and the seventh light-transmitting film layer.

6. The display panel according to claim 1, wherein the light-emitting device layer comprises: an organic light-emitting layer, a light coupling layer, and a light extraction layer stacked in sequence;
wherein orthographic projections of the organic light-emitting layer, the light coupling layer, and the light extraction layer on the substrate cover the opening regions respectively; and
orthographic projections of the cathodes on the substrate are partially overlapped with the orthographic projection of the flexible layer on the substrate.

7. The display panel according to claim 1, further comprising an encapsulation layer, located at a side of the light-emitting device layer away from the substrate, wherein an orthographic projection of the encapsulation layer on the substrate covers the off-screen camera region.

8. A display apparatus, comprising a display panel;
the display panel comprising a substrate, wherein the substrate comprises an off-screen camera region comprising a plurality of opening regions;
a flexible layer, located at a side of the substrate and provided with a plurality of through holes whose orthographic projections on the substrate coincide with the opening regions so that an orthographic projection of the flexible layer on the substrate is not overlapped with the opening regions, wherein the flexible layer is further provided with a plurality of blind holes that do not completely penetrate the flexible layer and orthographic projections of the plurality of blind holes on the substrate are in the off-screen camera region and not overlapped with the opening regions;
a backplate layer, located at a side of the flexible layer away from the substrate and comprising a plurality of light-transmitting film layers, wherein at least one light-transmitting film layer of the plurality of light-transmitting film layers fully covers the through holes and also covers at least part of a display region of the display panel apart from the through holes and thickness of part of the at least one light-transmitting film layer that fully covers the through hole is basically uniform; wherein the part of the at least one light-transmitting film layer that fully covers the through holes is separated by at least the blind holes from part of the at least one light-transmitting film layer that covers at least part of the display region of the display panel apart from the through holes, and
a light-emitting device layer, located at a side of the backplate layer away from the substrate and comprising a plurality of cathodes, wherein orthographic projections of the cathodes on the substrate are not overlapped with the opening regions.

9. The display apparatus according to claim 8, wherein the backplate layer comprises: a first light-transmitting film layer, an active layer, a second light-transmitting film layer, a plurality of gate electrodes, a third light-transmitting film layer, a plurality of source and drain electrodes, a fourth light-transmitting film layer, a fifth light-transmitting film layer, a plurality of anodes, a sixth light-transmitting film layer and a seventh light-transmitting film layer, which are stacked in sequence on the flexible layer;

wherein the first light-transmitting film layer, the second light-transmitting film layer, the third light-transmitting film layer, and the fourth light-transmitting film layer are inorganic film layers; and the fifth light-transmitting film layer, the sixth light-transmitting film layer and the seventh light-transmitting film layer are organic film layers.

10. The display apparatus according to claim 9, wherein in the opening regions, the substrate is covered by one or more of the fifth light-transmitting film layer, the sixth light-transmitting film layer and the seventh light-transmitting film layer.

11. The display apparatus according to claim 9, wherein in the opening regions, the substrate is covered by one or more of the first light-transmitting film layer, the second light-transmitting film layer, the third light-transmitting film layer and the fourth light-transmitting film layer.

12. The display apparatus according to claim 9, wherein in the opening regions, the substrate is covered by one or more of the first light-transmitting film layer, the second light-transmitting film layer, the third light-transmitting film layer, the fourth light-transmitting film layer, the fifth light-transmitting film layer, the sixth light-transmitting film layer and the seventh light-transmitting film layer.

13. The display apparatus according to claim 8, wherein the light-emitting device layer comprises: an organic light-emitting layer, a light coupling layer, and a light extraction layer stacked in sequence;

wherein orthographic projections of the organic light-emitting layer, the light coupling layer, and the light extraction layer on the substrate cover the opening regions respectively; and orthographic projections of the cathodes on the substrate are partially overlapped with the orthographic projection of the flexible layer on the substrate.

14. The display apparatus according to claim 8, further comprising an encapsulation layer, located at a side of the light-emitting device layer away from the substrate, wherein an orthographic projection of the encapsulation layer on the substrate covers the off-screen camera region.

15. A method of preparing a display panel, comprising:
providing a substrate, wherein the substrate comprises an off-screen camera region comprising a plurality of opening regions;
preparing a flexible layer and a backplate layer in sequence on the substrate, wherein the backplate layer comprises a plurality of light-transmitting film layers, the flexible layer is provided with a plurality of through holes whose orthographic projections on the substrate coincide with the opening regions so that an orthographic projection of the flexible layer on the substrate is not overlapped with the opening regions, wherein the flexible layer is further provided with a plurality of blind holes that do not completely penetrate the flexible layer and orthographic projections of the plurality of blind holes on the substrate are in the off-screen camera region and not overlapped with the opening regions, and at least one light-transmitting film layer of the plurality of light-transmitting film layers fully covers the through holes and also covers at least part of a display region of the display panel apart from the through holes and thickness of part of the at least one light-transmitting film layer that fully covers the through holes is basically uniform, wherein the part of the at least one light-transmitting film layer that fully covers the through holes is separated by at least the blind holes from part of the at least one light-transmitting film layer that covers at least part of the display region of the display panel apart from the through holes;
preparing a light-emitting device layer on the backplate layer, wherein the light-emitting device layer comprises a plurality of cathodes, and orthographic projections of the cathodes on the substrate are not overlapped with the opening regions.

* * * * *